United States Patent
Linder et al.

(10) Patent No.: US 6,825,110 B2
(45) Date of Patent: Nov. 30, 2004

(54) METHOD FOR FABRICATING SEMICONDUCTOR COMPONENT WITH AN OPTIMIZED THICKNESS

(75) Inventors: Stefan Linder, Zofingen (CH); Hans Rudolf Zeller, Birr (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 10/312,729

(22) PCT Filed: Jul. 4, 2001

(86) PCT No.: PCT/CH01/00416

§ 371 (c)(1),
(2), (4) Date: Dec. 30, 2002

(87) PCT Pub. No.: WO02/03469

PCT Pub. Date: Jan. 10, 2002

(65) Prior Publication Data

US 2003/0143836 A1 Jul. 31, 2003

(30) Foreign Application Priority Data

Jul. 4, 2000 (DE) .......................... 100 31 781

(51) Int. Cl.⁷ .......................... H01L 21/4763
(52) U.S. Cl. ...................... 438/627; 257/142
(58) Field of Search ........................ 438/627

(56) References Cited

U.S. PATENT DOCUMENTS

| 5,528,058 A | * | 6/1996 | Pike et al. | .................. | 257/142 |
| 5,668,385 A | * | 9/1997 | Bauer et al. | ................ | 257/139 |

FOREIGN PATENT DOCUMENTS

| DE | 4326052 A1 | 2/1994 |
| DE | 4313170 A1 | 10/1994 |
| DE | 19630341 A1 | 7/1997 |
| DE | 19651108 A1 | 10/1997 |
| DE | 19640307 A1 | 4/1998 |
| DE | 19731495 A1 | 1/1999 |
| DE | 19829614 A1 | 1/2000 |
| DE | 19860581 A1 | 7/2000 |
| EP | 60145660 | 8/1985 |
| EP | 0700095 A2 | 3/1996 |
| EP | 0702401 A2 | 3/1996 |
| EP | 0840379 A2 | 5/1998 |
| EP | 1017093 A1 | 7/2000 |

OTHER PUBLICATIONS

Darryl Burns et al., "NPT–IGBT—Optimizing for Manufacturability", Proceedings of the 8$^{th}$ International Symposium on Power Semiconductor Devices and IC's (ISPSD). Maui, Hawaii, May 20–23. 1996, Proceedings of the International Symposium on Power Semiconductor Devices and IC's (ISPSD), New York, IEEE, US, Bd. Symp. 8, May 20, 1996, XP000598450.

J. Yamashita et al., "A Novel Effective Switching Loss Estimation of Non–Punchthrough and Punchthrough IGBTs", 1997 IEEE International Symposium on Power Semiconductor Devices and ICS. Weimar, May 26–29 1997, IEEE International Symposium on Power Semiconductor Devices and ICS, New York, NY, XP000800169.

\* cited by examiner

*Primary Examiner*—David Nelms
*Assistant Examiner*—Thao P. Le
(74) *Attorney, Agent, or Firm*—Burns, Doane, Swecker & Mathis, L.L.P.

(57) ABSTRACT

In a method for fabricating a semiconductor component with a cathode and an anode from a wafer, the wafer is first provided with a stop zone, thereupon treated on the cathode side and only then reduced in its thickness, so that all that remains of the stop zone is a tail barrier zone. In this case, the stop zone is doped and reduced to the tail barrier zone in such a way that a quantitative optimization of the fabrication method and thus of a thinned semiconductor element is made possible. In said quantitative optimization, diverse parameters and their relation to one another are taken into account, in particular a dopant area density of a tail barrier zone, a dopant density at an anodal surface of the tail harrier zone, a dopant density of a base, a characteristic decay length or slope of the doping profile of the tail barrier zone, and also a thickness of a base—resulting from the wafer—from anode to cathode.

10 Claims, 4 Drawing Sheets

METHOD FOR FABRICATING SEMICONDUCTOR COMPONENT WITH AN OPTIMIZED THICKNESS

FIELD OF THE INVENTION

The invention relates to the field of power electronics. It relates to a method for fabricating a semiconductor component with a cathode and an anode formed on a wafer, and to a semiconductor element.

BACKGROUND OF THE INVENTION

In order to obtain the best possible electrical characteristics of semiconductor power switches, such as for example of an IGBT (Insulated Gate Bipolar Transistor), the thickness of the active zone of its semiconductor element must be chosen to be as small as possible.

By way of example, the thickness directly influences the on-state losses and the avalanche breakdown voltage. Therefore, semiconductor element thicknesses of 60–250 μm are desirable in the case of breakdown voltages of 60–1800 V. However, such small thicknesses pose a major problem in the production of the semiconductor elements since wafers having a diameter of 100 mm or more should have a thickness of at least 300 μm in order to minimize the risk of breaking during fabrication.

The prior art has usually solved this thickness problem for punch-through power semiconductors (PT) by means of the so-called epitaxy method. In this method, an electrically active layer is grown on a carrier substrate with a relatively large thickness of 400–600 μm. In this case, the rule applies that the active layer must be thicker, the higher the intended dielectric strength of the semiconductor element. Applying this layers is very time-intensive and expensive, however.

For larger breakdown voltages, in the prior art, a stop layer, also called a buffer, is preferably introduced between carrier layer and electrically active zone. Said stop layer serves, in the blocking case, for abruptly decelerating the electric field before the anode and thus keeping it away from said anode, since the semiconductor element can be destroyed if the electric field reaches the anode. In combination with a transparent anode emitter, the stop layer furthermore influences the injection efficiency of the anode emitter. A thyristor with a stop layer of this type and with a transparent anode emitter is described in EP-A-0,700,095.

For the fabrication of non-punch-through power semiconductors (NPT), use is made not of the epitaxial method but rather of a method as described for example in Darryl Burns et al., NPT-IGBT-Optimizing for manufacturability, IEEE, pages 109–112, 0-7803-3106-011996; Andreas Karl, IGBT Modules Reach New Levels of Efficiency, PCIM Europe, Issue 1/1998, pages 8–12 and J. Yamashita et al., A novel effective switching loss estimation of non-punchthrough and punchthrough IGBTs, IEEE, pages 331–334, 0-7803-3993-2/1997. In this method, a relatively thick wafer without an epitaxial layer serves as starting material. Typical thicknesses are 400–600 μm. In a first step, the wafer is treated on the cathode side, that is to say photolithography, ion implementation, diffusions, etchings and other processes required for the fabrication of the semiconductor element are carried out. In a second step, the wafer is reduced to its desired thickness on the side opposite to the cathode. This is done by customary techniques, generally by grinding and etching. In a third step, an anode is then indiffused on this reduced side. Although this method is more cost-effective than the epitaxy method, it leads to thicker semiconductor elements.

DE-A-198 29 614 discloses a fabrication method for a power semiconductor element based on a PT type which makes it possible to fabricate relatively thin semiconductor elements without having to employ the epitaxy method. For this purpose, a stop layer having a greater thickness than electrically necessary is introduced into a lightly doped base zone, process steps for embodying a cathodal patterned surface of the semiconductor element are then carried out and only afterward is the thickness of the stop layer reduced to the electrically required size by grinding and/or polishing. As a result, it is possible to carry out the cathodal process steps on a relatively thick wafer, thereby reducing the risk of breaking. Nevertheless, by virtue of the subsequent thinning of the wafer, a semiconductor element having the desired small thickness can be produced. The minimum thickness of the finished semiconductor elements is no longer limited by a minimum thickness that can be achieved for its starting material. What is advantageous, moreover, is that the doping of the residual stop layer is relatively low, so that the emitter efficiency can be set by way of the doping of the anode emitter.

The European patent application EP-A-1,017,093—still unpublished—also describes such a method for fabricating a semiconductor element. This method makes it possible to fabricate relatively thin semiconductor elements having a typical thickness of 80–180 μm. In this method, a doping profile which corresponds to a Gaussian profile or a complementary error function profile is preferably chosen. Consequently, after thinning, all that remains of the barrier zone is a residual zone or tail, called tail barrier zone hereinafter. The doping and then the thinning are performed in such a way that the tail barrier zone has, at its anodal surface, a doping density of at least $5 \times 10^{14}$ cm$^{-3}$, preferably $1 \times 10^{15}$ cm$^{-3}$, and, as maximum, $6 \times 10^{16}$ cm$^{-3}$, preferably $1 \times 10^{16}$ cm$^{-3}$. These values correspond to empirical values found by the applicant and are intended to avoid a negative influence on the anode efficiency.

Although good results are obtained with these empirical values, the fabrication of semiconductor elements thinned in this way is still based on the empirical values which were obtained in the fabrication of PT semiconductor elements according to the epitaxy method and in the fabrication of unthinned NPT semiconductor elements. Therefore, not all the possibilities for optimizing thinned semiconductor elements are exploited.

SUMMARY OF THE INVENTION

Therefore, it is an object of the present invention to improve the abovementioned method for fabricating a thinned power semiconductor element, so that it is possible to produce an optimized semiconductor element. In particular, it is intended that its thickness can be optimized to a respectively desired dielectric strength.

This object is achieved by embodiments of the method and semiconductor element described herein.

The invention enables a quantitative optimization of the fabrication method and thus of a thinned semiconductor element. In said quantitative optimization, diverse parameters and their relation to one another are taken into account, in particular a dopant area density of a tail barrier zone, a dopant density at an anodal surface of the tail barrier zone, a dopant density of a base, a characteristic decay length or slope of the doping profile of the tail barrier zone, and also a thickness of a base—resulting from the wafer—from anode to cathode.

In a first variant of the method, for a respectively required dielectric strength, a lower and an upper limit value are specified for the dopant area density of the tail barrier zone. In this case, the limits vary in a manner directly and/or indirectly dependent on the parameters specified above. The upper limit takes account of a characteristic decay length of the doping profile of the tail barrier zone and the lower limit takes account of a punch-through degree defined as the ratio of a punch-through voltage in accordance with formula (8) and an avalanche breakdown voltage.

In a second variant of the method, the semiconductor element is optimized by bringing the product of the doping atom density of the tail barrier zone at the surface with the characteristics decay length of the tail barrier zone into a fixed relation with the avalanche breakdown voltage, Further advantageous variants and embodiments emerge from the dependent patent claims.

BRIEF DESCRIPTION OF THE DRAWINGS

The method according to the invention and the subject matter of the invention are explained in more detail below using a preferred exemplary embodiment illustrated in the accompanying drawings, in which.

DETAILED DESCRIPTION OF THE INVENTION

FIGS. 1a–1e show a fabrication method for thinned power semiconductor elements as is described in detail in EP-A-1,017,093. This method is suitable in particular for the fabrication of IGBTs, but can also be applied to other power semiconductor elements.

Figure 1A:
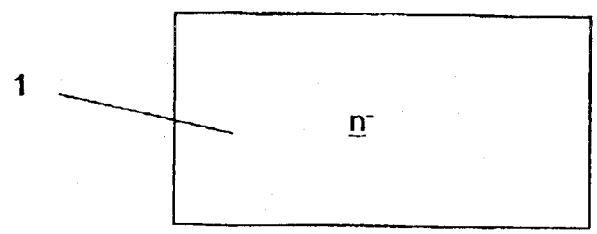
FIGS. 1a–1e show the fabrication of a semiconductor element from the starting material to the end product in accordance with EP-A-1,017,093.
Figure 1B:
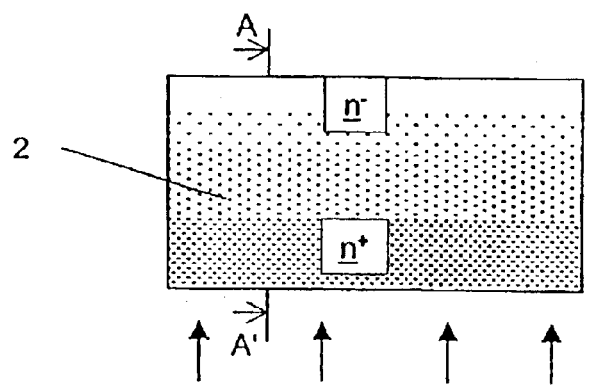
Figure 1C:
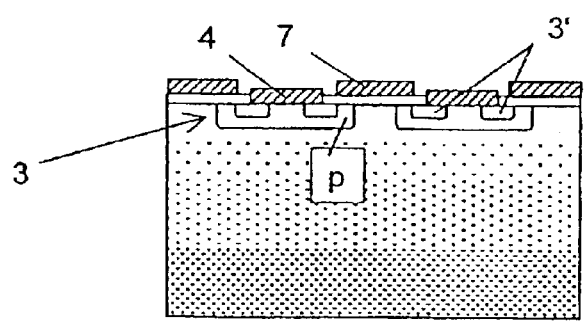
Figure 2:
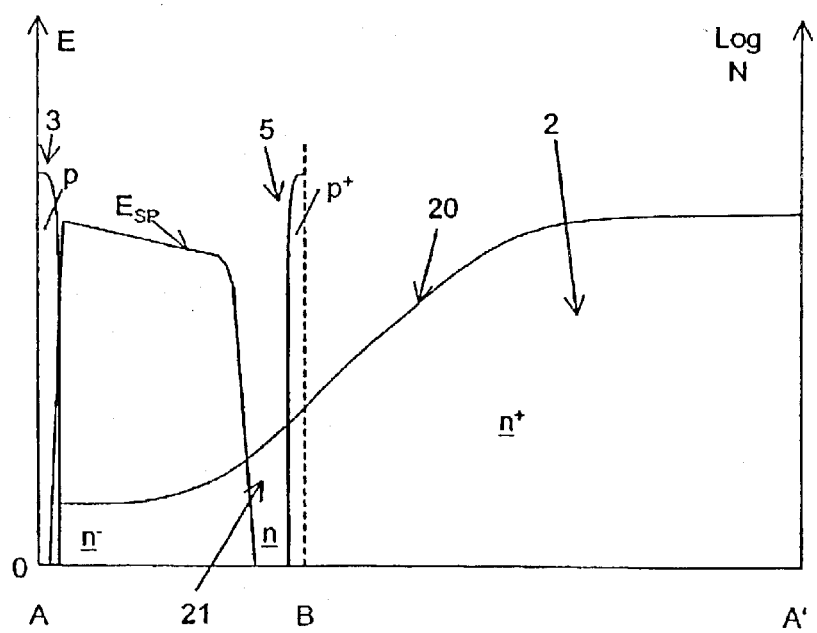
FIG. 2 shows a graphical illustration of a diffusion profile and of the electric field in blocking operation along the section A–A' in accordance with FIG. 1b and the section A–B in accordance with FIG. 1e.

In the text below, the method is not discussed comprehensively, rather only the most essential steps shall be presented again. The starting point for the method is a one-piece, preferably uniformly n⁻-doped wafer 1 having a typical thickness of 400–600 μm, as is illustrated in FIG. 1a. As can be seen in FIG. 1b, a diffusion profile 2 is produced in the wafer 1, which diffusion profile increases at the source side (FIG. 2), undergoing a transition from a lightly n-doped zone to a highly doped n⁺-type zone. In this case, the form of the doping profile is preferably Gaussian or corresponds to a complementary error function. In a next step, illustrated in FIG. 1c, a cathode structure 3 with an n⁺-doped cathode 3', a cathode metalization layer 4 and preferably a control electrode 7 are applied and introduced by means of known processes.

Figure 1D:
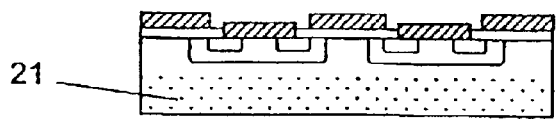
Figure 1E:
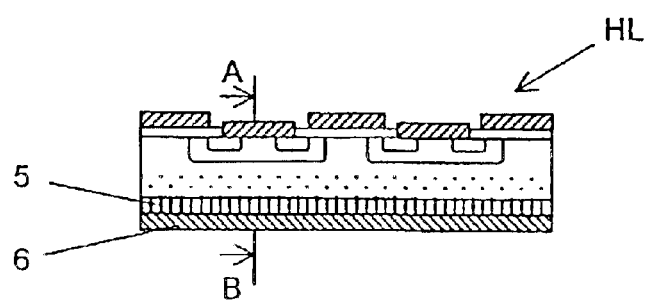

In a next step in accordance with FIG. 1d, the thickness of the wafer 1 is then reduced on the anode side, preferably by grinding and etching, so that all that remains is a tail barrier zone 21. A tail barrier zone with a flank that is as flat as possible and a low doping is desirable in this case, so that the previous diffusion profile should be as deep as possible.

Afterward, an anode with a p⁺-doped, transparent anode emitter is introduced onto the surface of said tail barrier zone 21 by corresponding doping of an edge zone. Afterward, a second metal layer, the anode metalization layer 6, is also applied on this side for the purpose of contact connection.

According to the invention, this fabrication method is now quantitatively optimized by means of a dimensioning rule. In this case, the optimization is effected with regard to a predetermined avalanche breakdown voltage, also called breakdown voltage. This dimensioning rule takes account of diverse process parameters and their relation to one another, in particular the doping atom area density of the tail barrier zone, the doping atom density at the anodal surface, the doping atom density of the wafer and of the base produced from it, a characteristic decay length of the tail barrier zone, and the thickness of the semiconductor element, more precisely of the base from anode to cathode.

The text below describes the dimensioning rule in accordance with a first variant of the method according to the invention:

the starting point is formed by a tail barrier zone which has been produced from a deep diffusion profile in Gaussian form or a complementary error function form. Depending on the desired dielectric strength, a lower and an upper limit value are specified for the doping atom area density of the tail barrier zone. In this case, the upper limit takes account of a characteristic decay length of the doping profile of the tail barrier zone and the lower limit takes account of a punch-through degree, which is explained below.

The upper limit is defined in the region above which it would appreciably influence the anode efficiency. As long as this upper limit is not reached, the process parameters additionally remain controllable, so that the number of deficient semiconductor elements can be kept low during fabrication.

Figure 3:
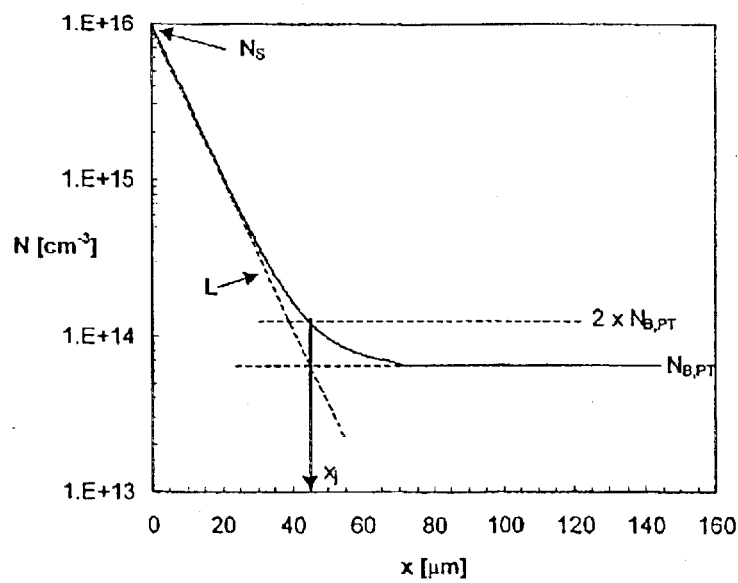
FIG. 3 shows a graphical illustration of a doping density as a function of a distance x from the anode.

The tail barrier zone has a basic doping $N_0$ and at least approximately an additional doping profile in accordance with the function $$N(x) = N_S \cdot \exp\left(-\frac{x}{L}\right) \tag{1}$$

where $N_S$ is the dopant density [cm⁻³] in the anodal surface of the tail barrier zone and $N_0$ is the dopant density of the wafer or of the base produced therefrom. x is the position [cm] in a system of coordinates with the origin at the pn junction from the tail barrier zone to the anode, x ascending in the direction of the cathode, as is illustrated in FIG. 3. L is the decay length of the doping profile in the tail barrier zone. $L_S$ being given by the gradient of the straight line through N(x=0) and N($x_j$), with $x_j$ as the point at which the doping has twice the value of the base doping $N_0$.

The doping atom area density contained in the tail barrier zone is given by $$N_{tail} = \int_0^{x_j+W_{PT}} N(x) \cdot dx = \int_0^{x_j+W_{PT}} N_S \cdot \exp\left(-\frac{x}{L}\right) \cdot dx \quad (2)$$

$W_{PT}$ is defined further below in the text. Since, in the practical case, $N_S$ has decayen to zero at the cathode, the integration can be set at $\infty$ with no significant error.

$$N_{tail} = \int_0^\infty N_S \cdot \exp\left(-\frac{x}{L}\right) \cdot dx = N_S \cdot L \quad (3)$$

which thus specifies the doping atom area density in the tail barrier zone as a function of the surface concentration $N_S$. Proceeding from a maximum acceptable surface concentration of $N_{S,max}=10^{16}$ cm$^{-3}$, the maximum doping atom area density $N_{tail,max}$ is thus obtained in the tail barrier zone and thus as upper limit:

$$N_{tail,max} = 10^{16} \text{ cm}^{-3} \cdot L. \quad (4)$$

In the case where the donor type of the tail barrier zone is n-valued, where n corresponds to the number of electrons emitted into the conduction band by the donor at room temperature, the value in accordance with formula (4) is divided by n.

The lower limit of the doping atom area density is defined in the region in which, in blocking operation, it is necessary to completely reduce the electric field before reaching avalanche breakdown in the tail barrier zone. Specifically, the electric fields must not under any circumstances reach the anode diffusion before the avalanche breakdown occurs. Otherwise, the punch-through breakdown results which, in contrast to the avalanche breakdown, is highly likely to lead to the destruction of the semiconductor. In this case, the maximum electric field $E_{max}$ at the onset of the avalanche breakdown is intended to satisfy the following formula $$E_{max} \cong K \cdot K_0^{1/8} \quad (5)$$

where K=4010 V cm$^{-5/8}$.

The calculation of the minimum doping atom area density in the stop layer is limited to room temperature since this represents the worst case. At a higher temperature, a higher doping atom area density is also required on account of the increased field strength in the avalanche breakdown. However, said density still lies far below the upper limit already mentioned. The same also applies to the idealization that has likewise been made, namely that the voltage yield of the avalanche breakdown is 100%.

The following relationship exists between a voltage $V_{br,PT}$ in the case of avalanche breakdown and the n-type base having the thickness $W_{PT}$, where $W_{PT}$ is defined as the length of $x_j$ as far as the cathodal surface of the base or as far as a pn junction of the base:

$$V_{br,PT} \cong \left(K \cdot N_{B,PT}^{1/8} - \frac{q \cdot N_{B,PT}}{2 \cdot \varepsilon_{Si} \cdot \varepsilon_0} \cdot W_{PT}\right) \cdot W_{PT}, \quad (6)$$

where $\varepsilon_{si}$ is the dielectric constant of the wafer material, here of silicon, and is approximately 11.9 in this case, and $\varepsilon_0$ denotes the permittivity of free space. q is the charge of the electron.

In order to determine the lower limit, a punch-through degree $\gamma$ is now introduced:

$$\gamma \equiv \frac{V_{punch-through}}{V_{br,PT}}, \quad (7)$$

where $V_{punch-through}$ represents the voltage at which the electric field runs to the tail barrier zone. In this case $V_{punch-through}$ shall be by definition the voltage, applied to the external contacts, at which the electric field tends toward zero in the absence of the stop layer at the location $x=x_j$:

$$V_{punch-through} = \frac{q \cdot N_{B,PT}}{2 \cdot \varepsilon_{Si} \cdot \varepsilon_0} \cdot W_{PT}^2. \quad (8)$$

The following thus results $$W_{PT} = \sqrt{\frac{2 \cdot \varepsilon_{Si} \cdot \varepsilon_0}{q \cdot N_{B,PT}} \cdot \gamma \cdot V_{br,PT}}. \quad (9)$$

The profile of the electric field during the avalanche breakdown ($V_{br,PT}$) can now be determined from $N_{B,PT}$ and $W_{PT}$ using Poisson's equation. At the boundary with the stop layer, under these conditions the electric field is $$E(W_{PT}) \cong K \cdot N_{B,PT}^{1/8} - \frac{q \cdot N_{B,PT}}{\varepsilon_{Si} \cdot \varepsilon_0} \cdot W_{PT}. \quad (10)$$

Figure 4:
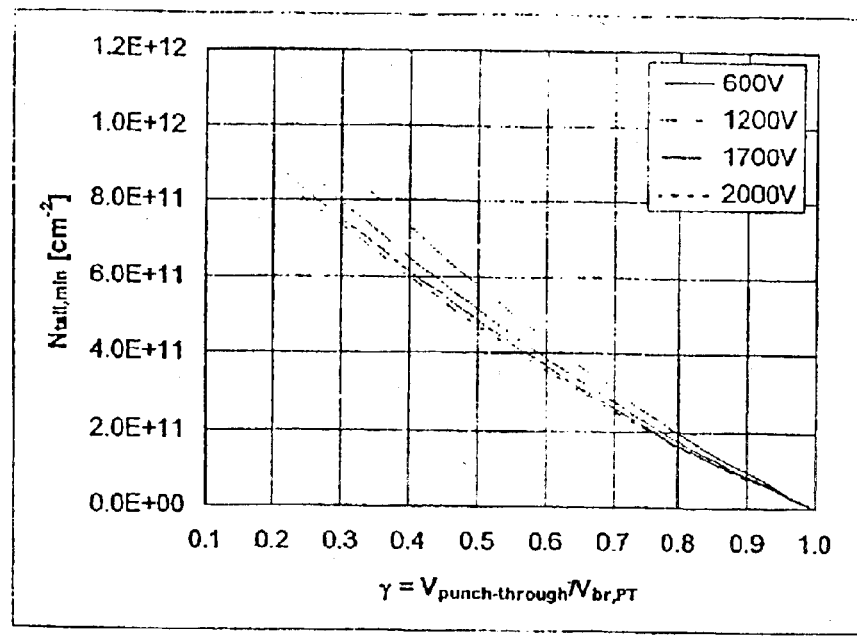
FIG. 4 shows a graphical illustration of a lower limit for a doping atom area density $N_{tail, min}$ as a function of $\gamma$ for various avalanche breakdown voltage values V.

In order to lower the field from $E(W_{PT})$ to zero, $$N_{tail,min} \equiv \frac{E(W_{PT}) \cdot \varepsilon_{Si} \cdot \varepsilon_0}{q} \quad (11)$$

is necessary independently of the form of the doping profile in the stop layer as lower limit for the doping atom area density. The values can be obtained numerically. FIG. 4 shows the lower limit of the doping atom area density $N_{tail,min}$ as a function of $\gamma$ for various breakdown voltage values V. In the case where the donor type in the tail barrier zone is n-valued, the values of the doping atom area density in accordance with FIG. 4 are to be divided by n.

The text below describes the dimensioning rule in accordance with a second variant of the method according to the invention:

The starting point is again formed by a tail barrier zone whose doping concentration has approximately the following form:

$$N(x) = N_0 + N_S \cdot \exp(-x/L) \quad (12)$$

In this case, $N_0$ is once again the doping of the base, $N_S$ is the surface concentration at the anodal surface of the tail barrier zone and L is the characteristic decay length of the doping profile in the tail barrier zone.

The process parameters width W of the base, characteristic length L of the doping profile, doping density $N_0$ of the base and surface doping density $N_S$ of the tail barrier zone are now intended to be brought into an optimized relation with respect to one another in order to fabricate an optimized thinned power semiconductor element in accordance with the invention. In this case, the following criteria are intended to be met for the optimization:

at the breakdown voltage V, the space charge zone extend at least approximately precisely as far as the anode, and at the breakdown voltage V, the maximum electric field at the cathode is intended to correspond to the breakdown field, for a given thickness of the basis, the breakdown voltage is to be maximised In this variant of the method, W is designated as $W_b$, which differs from $W_{PT}$ used above. $W_b$ is the width of the base, measured from the anodal pn junction as far as the cathodal surface of the base or as far as a pn junction of the base.

From equation (12), the following is obtained for the electric field $$E(W_b) = \frac{q}{\varepsilon \cdot \varepsilon 0} \cdot (N_0 \cdot W_b + N_s \cdot L \cdot (1 - \exp(-W_b/L))) \tag{13}$$

Since $\exp(-W_b/L) \ll 1$, it follows from equation (13) that $$E(W_b) = \frac{q}{\varepsilon \cdot \varepsilon 0} \cdot (N_0 \cdot W_b + N_s \cdot L) \tag{14}$$

The maximum breakdown voltage is given as $$V_{max}(W_b) = \frac{q}{2} \cdot \frac{N_0 \cdot W_b^2 + 2 \cdot L \cdot N_s \cdot W_b - 2 \cdot L^2 \cdot N_s}{\varepsilon \cdot \varepsilon_0} \tag{15}$$

In this case, the breakdown voltage V corresponds to the breakdown voltage $V_{br,PT}$ described in the first variant.

A buffer charge shall be defined as $$Q_b = q \cdot \int_0^{W_b} N_s \cdot \exp\left(-\frac{x}{L}\right) dx = q \cdot L \cdot N_s \tag{16}$$

and a charge of the n-type base as $$Q_0 = q \cdot N_0 \cdot W_b \tag{17}$$

The following results therefrom $$E(W_b) = \frac{Q_0 + Q_b}{\varepsilon \cdot \varepsilon 0} \tag{18}$$

If account is now taken of the electric field during the breakdown $$E_{max} = K \cdot N_0^{1/8} \tag{19}$$

where $K = 4010 \cdot V \cdot cm^{-6/8}$ normally holds true, the following results for the maximum voltage $$V = K \cdot N_0^{1/8} \cdot (W_b - L) - \frac{q \cdot N_0}{\varepsilon \cdot \varepsilon 0} \cdot \left(\frac{W_b^2}{2} - W_b \cdot L\right) \tag{20}$$

The optimum doping density in the base can be calculated from $N_0$ for the case where the electric field at the junction corresponds to the maximum electric field:

$$N_{opt} = \left[\frac{\varepsilon \cdot \varepsilon 0 \cdot K \cdot (W_b - L)}{4 \cdot q \cdot W_b \cdot (W_b - 2 \cdot L)}\right]^{\frac{8}{7}} \tag{21}$$

For the case where $(W_b/L)^2 \gg 1$, a new variable $W_{red} = W_b - L$ can be defined, so that it follows from equations (20) and (21) that:

$$V \approx K \cdot N_0^{1/8} \cdot W_{red} - \frac{q \cdot N_0}{2 \cdot \varepsilon \cdot \varepsilon 0} \cdot W_{red}^2 \tag{22}$$

$$N_{opt} \approx \left[\frac{\varepsilon \cdot \varepsilon 0 \cdot K}{4 \cdot q \cdot W_{red}}\right]^{\frac{8}{7}} \tag{23}$$

An optimum breakdown voltage can be calculated therefrom $$V_{opt} = \frac{7}{8} \cdot W_{red} \cdot N_{opt}^{1/8} \cdot K = \frac{7}{8} \cdot W_{red} \cdot E_{max} \tag{24}$$

and a minimum thickness of the base or of the semiconductor element which is still suitable for this breakdown voltage:

$$W_{red}^{min} = \frac{8}{7 \cdot N_{opt}^{1/8} \cdot K} \cdot V \tag{25}$$

which numerically becomes $$W_{red}^{min} = 1.70 \cdot 10^{-2} \cdot V^{\frac{7}{6}} \tag{26}$$

with W in $\mu$m and V in Volt.

This results in the following for the optimum doping density in the n-type base $$N_{opt} = \frac{7 \cdot 14^{\frac{1}{3}}}{128} \cdot \left(\varepsilon \cdot \varepsilon_0 \cdot \frac{K^2}{q}\right)^{\frac{4}{3}} \cdot V^{-\frac{4}{3}} \tag{27}$$

and numerically $$N_{opt}(\text{in cm}^{-3}) = 6.31 \cdot 10^{17} \, V^{-4/3} \, [\text{in Volt}^{-4/3}] \tag{28}$$

In this case, it emerges that values for $N_{opt}$ of up to $8 \cdot 10^{17}$ $V^{-1/8}$ lead to useable results.

For the optimum surface concentration of the tail barrier zone, the following results by calculating the optimum buffer charge $$N_s = \left(\frac{1}{W_{red}^{min}}\right)^{\frac{1}{7}} \cdot \left(\left[\frac{K \cdot \varepsilon \cdot \varepsilon_0}{4 \cdot q}\right]\right)^{\frac{8}{7}} \cdot \frac{3}{L} \tag{29}$$

or numerically (V in V, $N_S$ in cm$^{-3}$, L and $W_{red}$ in $\mu$m)

$$N_s \cdot L = 1.79 \cdot 10^{18} \cdot W_{red}^{-\frac{1}{7}} \tag{30}$$

$$N_s \cdot L = 3.20 \cdot 10^{16} \cdot V^{-\frac{1}{8}} \tag{31}$$

Consequently, this second variant of the method yields a fixed relationship between the product of the doping atom density of the tail barrier zone at the surface and the decay length of the tail barrier zone as a function of the breakdown voltage. If values which correspond at least approximately to said product are chosen for $N_S$ and L, then an optimum semiconductor element is produced. At least approximately is understood to mean in particular a factor F lying between 0.5 and 1.2.

A length of 5–10 $\mu$m is preferably chosen for L, as a result of which it is possible to obtain a surface concentration $N_S$ of the order of magnitude of $10^{15}$ cm$^{-3}$.

Figure 5:
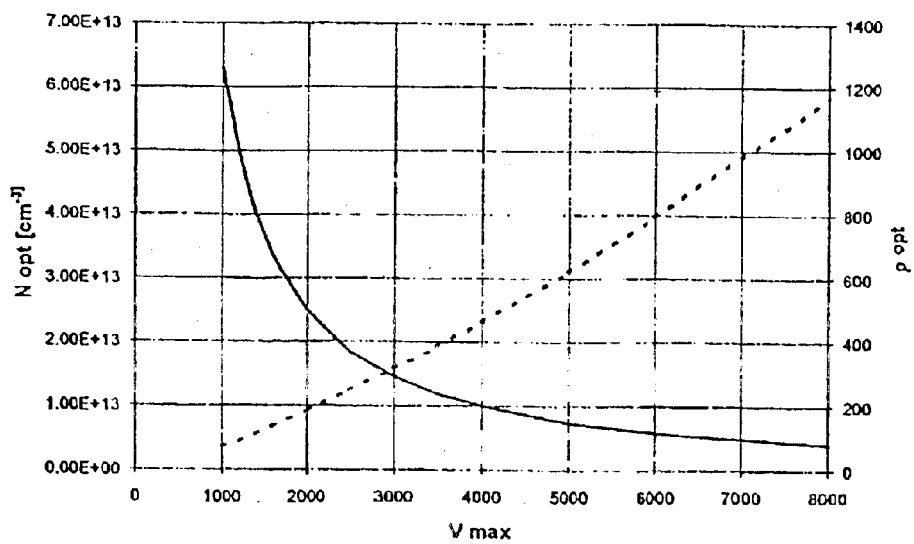
FIG. 5 shows a graphical illustration of an optimum base doping $N_{opt}$ and of an optimum base resistivity as a function of a maximum avalanche breakdown voltage V.
Figure 6:
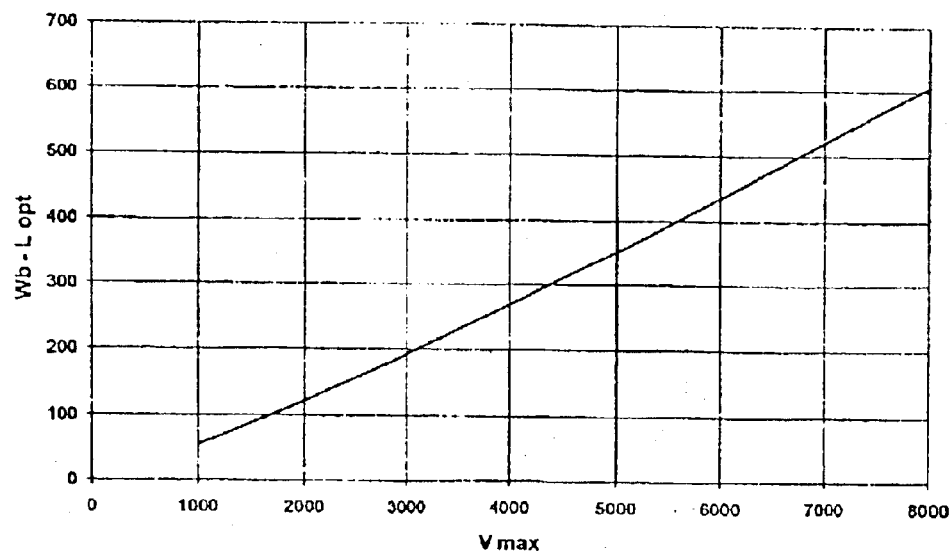
FIG. 6 shows a graphical illustration of the difference between an optimized thickness W of a semiconductor element and a characteristic length L of a tail barrier zone as a function of the maximum breakdown voltage V.
Figure 7:
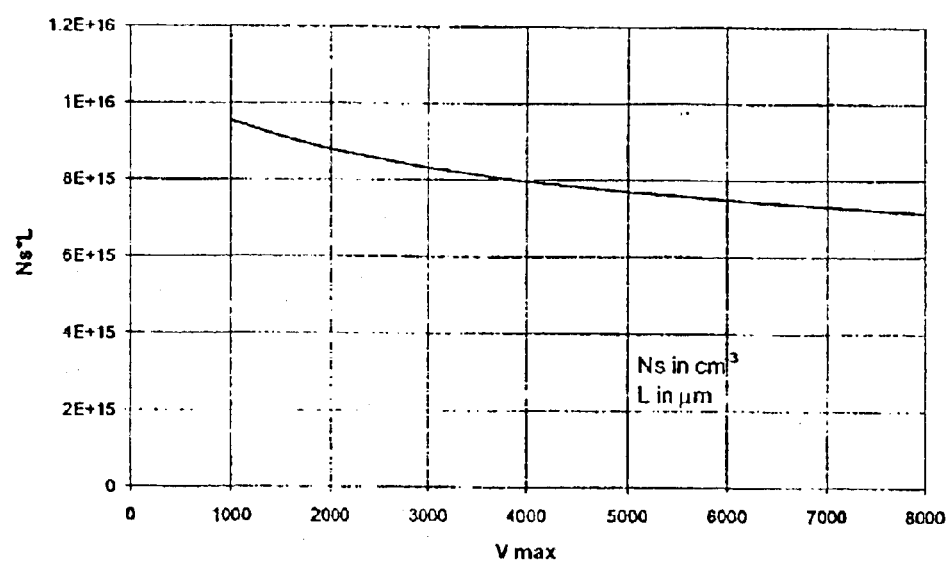
FIG. 7 shows a graphical illustration of an optimum product of a surface concentration $N_S$ with a characteristic decay length L as a function of the maximum breakdown voltage V.

FIGS. 5 to 7 illustrate numerical values of the individual process parameters or of combinations thereof. These numerical values were obtained through the formulae used in the second variant of the method. FIG. 5 shows, on the one hand, an optimum base doping $N_{opt}$ and, on the other hand, the optimum base resistivity as a function of the maximum breakdown voltage $V_{max}$, FIG. 6 shows the difference between the optimized thickness W of the semiconductor element and the characteristic length L of the tail barrier zone as a function of the maximum breakdown voltage $V_{max}$, and FIG. 7 illustrates the optimum product of the surface concentration $N_S$ and the characteristic decay length L as a function of the maximum breakdown voltage $V_{max}$.

Using the abovementioned dimensioning rules, it is possible to produce semiconductor elements which are optimized for their specific intended application, it being possible to minimize their development time and also the costs for their fabrication.

List of Reference Symbols

1 Wafer
2 Diffusion region
20 Doping profile
21 Stop zone
3 Cathode structure
3' Cathode
4 Cathode metalization layer
5 Anode
6 Anode metalization layer
7 Control electrode
HL Semiconductor element
$E_{SP}$ Electric field in blocking operation

What is claimed is:

1. A method for fabricating a semiconductor component with a cathode and an anode formed on a wafer, comprising treating the wafer first on the cathode side, reducing the thickness of the wafer thereupon on the side opposite to the cathode, and, in a further step, producing the anode on said side opposite to the cathode, introducing a stop layer before the cathodal treatment, and removing the stop layer except for a tail barrier layer zone during the reduction of the wafer thickness, wherein the stop layer is produced in the tail barrier layer zone and the stop layer has a dopant area density which lies between a minimum and a maximum area density, the maximum dopant area density being chosen in a manner dependent on a doping profile decay length in the tail barrier layer zone, and the minimum dopant area density being chosen in a manner dependent on a punch-through degree defined as the ratio of a punch-through voltage and an avalanche breakdown voltage.

2. The method as claimed in claim 1, wherein the maximum dopant area density is chosen to be directly proportional to the decay length of the tail barrier zone, with a proportionality factor that corresponds to a maximum acceptable surface concentration.

3. The method as claimed in claim 2, wherein the maximum acceptable surface concentration is $10^{16}$ cm$^{-3}$.

4. The method as claimed in claim 1, wherein the decay length L is defined by L $$L = \frac{x_j}{\ln\left(\frac{N_s}{N_0}\right)},$$

with $x_j$ the distance between the anode junction and the point where the total doping concentration has decayed to twice the value of the basic doping, and where the function in is the logarithm to the base of e.

5. The method as claimed in claim 1, wherein the minimum dopant area density is chosen in accordance with $$N_{tail,min} \equiv \frac{E(W_{pt}) \cdot \varepsilon_{Si} \cdot \varepsilon_0}{q}.$$

6. The method as claimed in claim 5, wherein n-valued donors are used, and $N_{tail,min}$ is divided by n.

7. A method for fabricating a semiconductor component with a cathode and an anode formed on a wafer, comprising treating the wafer first on the cathode side, reducing the thickness of the wafer thereupon on the side opposite to the cathode, and, in a further step, producing the anode on said side opposite to the cathode, introducing a stop layer before the cathodal treatment, and removing the stop layer except for a tail barrier layer zone during the reduction of the wafer thickness, wherein the tail barrier layer zone has a characteristic length L and the stop layer is produced at the anodal surface of the tail barrier layer zone and the stop layer has a dopant density $N_S$ such that the following at least approximately holds true $$N_s = \left(\frac{1}{W_{red}^{min}}\right)^{\frac{1}{7}} \cdot \left(\left[\frac{K \cdot \varepsilon \cdot \varepsilon_0}{4 \cdot q}\right]\right)^{\frac{8}{7}} \cdot \frac{3}{L}.$$

8. The method as claimed in claim 7, wherein the wafer is provided with a basic doping of at least approximately $$N_{opt} = \frac{7 \cdot 14^{\frac{1}{3}}}{128} \cdot \left(\varepsilon \cdot \varepsilon_0 \cdot \frac{K^2}{q}\right)^{\frac{4}{3}} \cdot V^{\frac{4}{3}}.$$

9. The method as claimed in claim 8, wherein the difference between the thickness of the semiconductor element and the characteristic length of the tail barrier zone is at least approximately equal to $$W_{red}^{min} = \frac{8}{7 \cdot N_{opt}^{1/8} \cdot K} \cdot V.$$

10. A semiconductor component with a cathode and an anode, a stop layer being present adjacent to the anode, a doping density of which stop layer increases toward the anode, the stop zone having a doping profile that is cut off toward the anode, and in that a stop zone has, in the anodal region, a doping atom area density which is at least approximately greater then $$N_{tail,min} \equiv \frac{E(W_{PT}) \cdot \varepsilon_{Si} \cdot \varepsilon_0}{q}.$$

* * * * *